(12) United States Patent
De Laat et al.

(10) Patent No.: US 6,579,792 B2
(45) Date of Patent: Jun. 17, 2003

(54) METHOD OF MANUFACTURING A SEMICONDUCTOR DEVICE

(75) Inventors: Walterus Theodorus Franciscus Maria De Laat, Eindhoven (NL); Johannes Van Wingerden, Eindhoven (NL); Petrus Maria Meijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/864,127

(22) Filed: May 24, 2001

(65) Prior Publication Data

US 2001/0051386 A1 Dec. 13, 2001

(30) Foreign Application Priority Data

May 25, 2000 (EP) .............................. 00201878

(51) Int. Cl.⁷ .............................................. H01L 21/44
(52) U.S. Cl. ..................... 438/671; 438/585; 438/636
(58) Field of Search ................... 438/671, 736, 438/636, 585, 738

(56) References Cited

U.S. PATENT DOCUMENTS

| | | | |
|---|---|---|---|
| 5,963,841 A | 10/1999 | Karlsson et al. | 438/952 |
| 6,013,582 A * | 1/2000 | Ionov et al. | 438/738 |
| 6,027,959 A | 2/2000 | En et al. | 438/142 |
| 6,174,818 B1 * | 1/2001 | Tao et al. | 438/736 |
| 6,297,170 B1 * | 10/2001 | Gabriel et al. | 438/738 |
| 6,365,320 B1 * | 4/2002 | Foote et al. | 438/783 |

* cited by examiner

Primary Examiner—Michael Trinh
(74) Attorney, Agent, or Firm—Aaron Waxler

(57) ABSTRACT

The invention relates to a method of manufacturing a semiconductor device, comprising the provision of a substrate (1) having a dielectric layer (2) on this substrate (1), a conductive layer (3) on the dielectric layer (2), an inorganic anti-reflection coating (4) on the conductive layer (3), and a resist mask (6) on the inorganic anti-reflection coating (4). The method further comprises the following steps: patterning the inorganic anti-reflection coating (4) by means of the resist mask (6), patterning the conductive layer (3) by etching down to the dielectric layer (2), removing the resist mask (6), and removing the inorganic anti-reflection coating (4). According to the invention, the inorganic anti-reflection coating (4) is removed by means of a dry etch, using a polymerizing gas. It is achieved by this that no or hardly any changes in the critical dimension will occur.

7 Claims, 1 Drawing Sheet

METHOD OF MANUFACTURING A SEMICONDUCTOR DEVICE

BACKGROUND OF THE INVENTION

The invention relates to a method of manufacturing a semiconductor device, comprising the provision of a substrate with a dielectric layer on this substrate, a conductive layer on the dielectric layer, an inorganic anti-reflection coating on the conductive layer, and a resist mask on the inorganic anti-reflection coating, which method comprises the following steps:

patterning the inorganic anti-reflection coating by means of the resist mask, patterning the conductive layer by etching down to the dielectric layer, removing the resist mask, and removing the inorganic anti-reflection coating.

Such a method is known from U.S. Pat. No. 5,963,841. Conductive gates are formed here in a semiconductor device through the use of a "bottom anti-reflective coating" (BARC). The starting material is the substrate provided with a dielectric layer as described above, a conductive layer, a BARC provided with an oxide layer, and a resist mask. The regions of the oxide layer selected by the resist mask, the BARC, and the conductive gate layer are etched. Then the resist mask is removed so that the subjacent oxide layer becomes exposed. The oxide layer is also removed then, which exposes the BARC. Finally, the remaining BARC is removed.

It was found in the known method that a loss of the critical dimension (CD) of the gate occurs. The dimension of the passage in the conductive layer does not correspond exactly any more to the dimension defined by the resist mask. A good CD control is of major importance in view of the continuing trend towards decreased dimensions of devices within an IC. It was also found that an edge roughness arises at the area of the etched groove in the conductive material.

SUMMARY OF THE INVENTION

The invention has for its object inter alia to provide a method of the kind described in the opening paragraph in which no or substantially no changes occur in the CD.

According to the invention, the method is for this purpose characterized in that the inorganic anti-reflection coating is removed by means of a dry etch step using a polymerizing gas.

The dry etch has a good selectivity with respect to the conductive layer (which is made, for example, of polycrystalline silicon) and oxide and thus causes no change in the CD. The known method uses a wet etch step. The invention is based on the recognition that this etch has a low selectivity between the anti-reflection coating (ARC) and the conductive layer (for example polycrystalline silicon) such that a CD loss occurs owing to the isotropic character of the etch.

In an embodiment of the method according to the invention, the inorganic ARC used is silicon oxynitride ($SiO_xN_y$). The layer of conductive material comprises, for example, polycrystalline silicon, but it may also be made of alternative materials such as SiGe and metals such as Al. After etching of the layer of conductive material, the Layer of $SiO_xN_y$ is removed by means of a dry etch. The dry etch preferably utilizes a polymerizing gas of type $CH_xF_y$, such as, for example, $CH_3F$. This etch has a good selectivity with respect to polycrystalline silicon and oxide. It should be noted that the values of x and y in $SiO_xN_y$ need not be the same as the values of x and y in $CH_xF_y$.

In a further embodiment, an oxide layer is used on the inorganic ARC, inter alia for preventing chemical contamination of the resist mask by the ARC. The oxide layer may be obtained not only through deposition but also through a plasma treatment of the $SiO_xN_y$ layer. In the latter case, a top layer arises with a thickness which is not accurately defined and which comprises more oxide than does the rest of the ARC. Since the dry etch by means of which the ARC is removed is selective with respect to oxide, the oxide present on the ARC is preferably removed before the ARC is removed in the dry etch. In a further embodiment, the resist mask is the first to be removed after the patterning of the oxide layer and the subjacent inorganic ARC by means of a resist mask. Then two steps for etching the polycrystalline silicon are carried out. First the oxide layer is removed in a known manner by means of an etch. It is possible that part of the $SiO_xN_y$ layer is etched at the same time during this if the etching process does not stop in time. Then the remaining portion of the $SiO_xN_y$ layer is used as a hard mask for etching the polycrystalline silicon in a known manner. The high selectivity of the polycrystalline silicon etch with respect to $SiO_xN_y$ achieves that the mask is not attacked. Finally, the remaining portion of the mask is removed in the dry etch step.

An additional advantage of the latter embodiment is that the inorganic hard mask by means of which the polycrystalline silicon is etched does not influence the etching chemistry. In U.S. Pat. No. 5,963,841, the polycrystalline silicon is etched by means of the organic resist mask, which does participate actively in the chemistry during the etching treatment and accordingly influences the final result.

Another advantage is that attacks on the dielectric layer situated under the polycrystalline silicon are prevented through the removal of the oxide layer before the polycrystalline silicon is etched. This dielectric layer consists, for example, of oxide (the so-called gate oxide). If this gate oxide is exposed already at the moment when the oxide layer is removed from the ARC, the etching treatment in which this removal is effected will also attack the gate oxide and the insulation.

BRIEF DESCRIPTION OF THE DRAWINGS

These and other aspects of the invention will be explained in more detail with reference to the drawing, in which

FIG. 1 is a cross-sectional view of the device after patterning of the oxide layer and the inorganic anti-reflection layer by means of the resist mask.

FIG. 2 shows the device after the removal of the resist mask and the oxide layer.

FIG. 3 shows the device after the conductive layer has been etched through.

FIG. 4 shows the device after the removal of the inorganic anti-reflection coating.

DETAILED DESCRIPTION OF THE INVENTION

Figure 1:
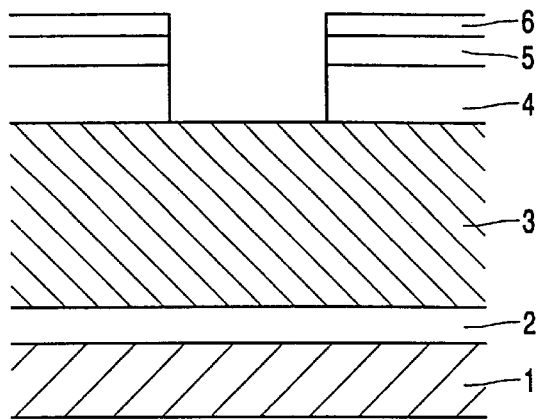
FIGS. 1 to 4 show a number of steps in a process according to the invention for the manufacture of a semiconductor device.

In FIG. 1, the semiconductor device has a silicon substrate 1 provided with a dielectric layer 2 on this substrate 1. This dielectric layer 2 comprises, for example, oxide (gate oxide). On the dielectric layer 2 there is a conductive layer 3 (gate layer) which in this embodiment is made of polycrystalline silicon. A layer of $SiO_xN_y$ on the conductive layer 3 is used as an inorganic anti-reflection coating (ARC) 4. The ARC 4 is covered with an oxide layer 5 on which subsequently a resist mask 6 is deposited. The oxide layer 5 and the ARC 4 are patterned by means of the resist mask 6. The CD of the gate is now defined by the etching openings in the resist mask 6.

Figure 2:
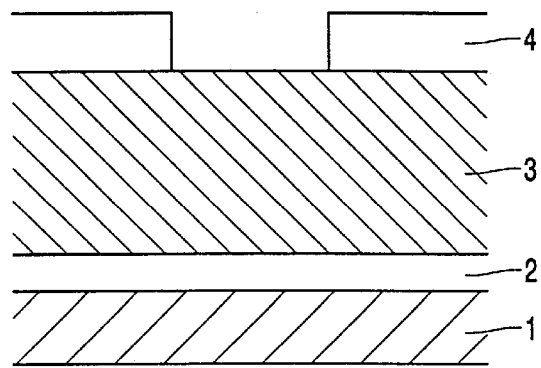

FIG. 2 shows the semiconductor device after the resist mask 6 has first been removed in a usual manner. After this removal of the resist mask 6, at least the oxide layer 5 is removed in an etching process. It is possible that during the etching treatment a portion of the ARC 4 is also removed. The remaining ARC 4 acts as a hard mask for etching the conductive layer 3.

Figure 3:
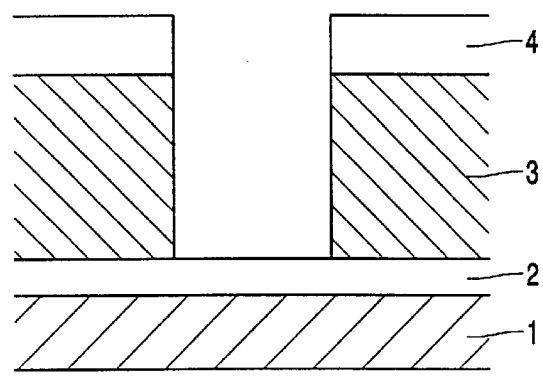

In FIG. 3, the conductive layer 3 is patterned, preferably through anisotropic etching down to the dielectric layer 2 with the use of a known gas combination such as, for example, $Cl_2/HBr/He/O_2$. The polycrystalline silicon etch has a high selectivity with respect to $SiO_xN_y$ among other substances and accordingly does not attack the mask.

The oxide layer 5 is removed before the conductive layer 3 is etched, because the exposed dielectric layer 2 would be attacked if the above were performed in reverse order.

Figure 4:
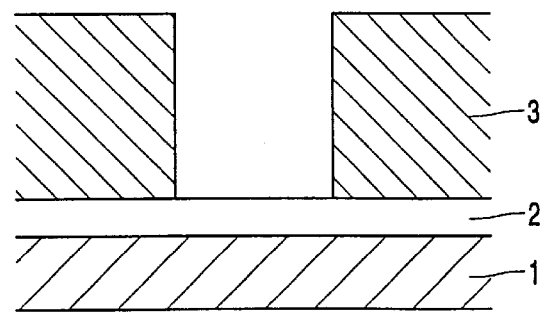

In FIG. 4, the inorganic ARC 4, which is also used as a hard mask for the polycrystalline silicon etch, is removed in a dry etching step with the use of a polymerizing gas. The polymerizing gas used is preferably a gas with the formula $CH_xF_y$, for example $CH_3F$. This etch has a good selectivity with respect to polycrystalline silicon and oxide. As a result, the ARC 4 can be removed without any change occurring in the CD. Because of the good selectivity of the dry etch with respect to oxide, it is desirable to remove the oxide layer 5 lying on the ARC 4 before the ARC 4 is removed.

After the polycrystalline silicon gates 3 have been defined, the device may be subjected to further usual and generally known process steps for the manufacture of integrated circuits, such as the provision of source and drain zones in the substrate 1 and the provision of connections between the transistors.

It will be obvious that the invention is not limited to the example described above, but that many more variations are possible to those skilled in the art within the scope of the invention. For example, it is possible to remove the oxide layer 5 from the inorganic ARC 4 during or at the beginning of the polycrystalline silicon etch.

What is claimed is:

1. A method of manufacturing a semiconductor device, comprising the provision of a substrate with a dielectric layer on the substrate, a conductive layer on the dielectric layer, an inorganic anti-reflective coating (ARC) on the conductive layer, an oxide layer on the ARC, and a resist mask on the oxide layer, comprising the steps of:
    patterning the oxide layer and ARC by means of the resist mask;
    removing the resist mask and oxide layer using a process that leaves the ARC intact;
    patterning the conductive layer using the ARC as a hard mask; and
    removing the ARC with a dry etch process using a polymerizing gas.

2. The method of claim 1, wherein the ARC includes $SiO_xN_y$.

3. The method of claim 1, wherein the polymerizing gas comprises $CH_xF_y$.

4. A method of manufacturing a semiconductor device, comprising the provision of a substrate with a dielectric layer on the substrate, a conductive layer on the dielectric layer, an inorganic anti-reflective coating (ARC) on the conductive layer, an oxide layer on the ARC, and a resist mask on the oxide layer, comprising the steps of:
    patterning the oxide layer and ARC by means of the resist mask using a first etching process;
    removing the resist mask and oxide layer such that the ARC is left substantially intact,
    patterning the conductive layer using a second etching process; and
    removing the ARC with a dry etch process using a polymerizing gas.

5. The method of claim 4, wherein the oxide layer is removed at the beginning of the patterning of the conductive layer.

6. The method of claim 4, wherein the oxide layer is removed prior to the patterning of the conductive layer using a third etching process.

7. The method of claim 4, wherein the polymerizing gas comprises $CH_xF_y$.

* * * * *